United States Patent [19]
Buonanno

[11] Patent Number: 4,857,668
[45] Date of Patent: Aug. 15, 1989

[54] MULTI-FUNCTION GASKET

[75] Inventor: Samuel S. Buonanno, Monroe, N.Y.

[73] Assignee: Schlegel Corporation, Rochester, N.Y.

[21] Appl. No.: 181,834

[22] Filed: Apr. 15, 1988

[51] Int. Cl.$^4$ ............................................. H05K 9/00
[52] U.S. Cl. ............................................. 174/35 GC
[58] Field of Search ..................... 174/35 GC, 35 R; 219/10.55 D

[56] References Cited

U.S. PATENT DOCUMENTS

| | | | |
|---|---|---|---|
| 2,477,267 | 7/1949 | Robinson | 174/35 GC |
| 3,312,769 | 4/1967 | La Kaff | 174/35 GC |
| 3,446,906 | 5/1969 | Zulauf | 174/35 GC |
| 3,555,168 | 1/1971 | Frykberg | 174/35 GC |
| 3,700,368 | 10/1972 | Wells | 425/115 |
| 3,781,390 | 12/1973 | Wells | 264/46.2 |
| 3,889,043 | 6/1975 | Ducros | 174/35 GC |
| 4,098,633 | 7/1978 | Kersten | 174/35 R X |
| 4,652,695 | 3/1987 | Busby | 174/35 GC |
| 4,659,869 | 4/1987 | Busby | 174/35 GC |
| 4,684,762 | 8/1987 | Gladfelter | 174/36 |
| 4,720,606 | 1/1988 | Senn | 174/35 GC |

FOREIGN PATENT DOCUMENTS 221904 5/1985 German Democratic Rep. ... 174/35 R

OTHER PUBLICATIONS

"Q-Lon"weatherstrip advertising brochure, Oct., 1982. Chomerics Corp. catalog, pp. 15-43 (publication date unknown).
Schlegel EMI Shielding Gaskets-Technical Data published May, 1987, less than one year prior to filing.

Primary Examiner—Morris H. Nimmo
Attorney, Agent, or Firm—Steele, Gould & Fried

[57] ABSTRACT

A multi-function gasket for electrical apparatus and the like, operation of which tends to generate or be adversely affected by electromagnetic and radio frequency interference (EMI/RFI), comprising: a continuously molded, resilient foam core having a sealed outer boundary layer when cured; a flexible, electrically conductive and substantially abrasion resistant sheath surrounding the foam core and bonded to the boundary layer as the foam expands within and fills the interior of the sheath during the molding; and, mounting structure for affixing the gasket. The apparatus may be sealed against EMI/RFI leakage, noise emission and enviromental infiltration through perimeter gaps of electrically conductive doors, access panels and the like by the actions and interactions of the sheath, the foam core and the boundary layer. The flexible sheath is continuously pressed into positive engagement with the conductive surfaces between which it is mounted by the resilient foam core, forming a continuous electrical path across the gaps and preventing EMI/RFI leakage through the gaps. The boundary layer prevents noise emission and environmental infiltration across the gaps. The sheath protects the boundary layer against damage from abrasion and the like.

18 Claims, 2 Drawing Sheets

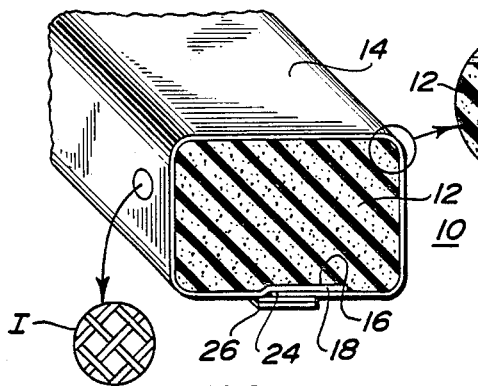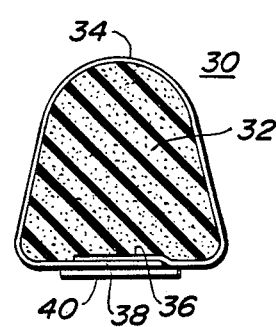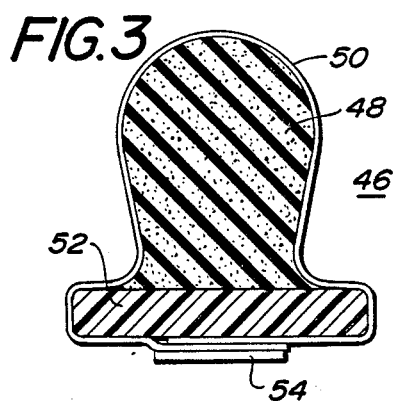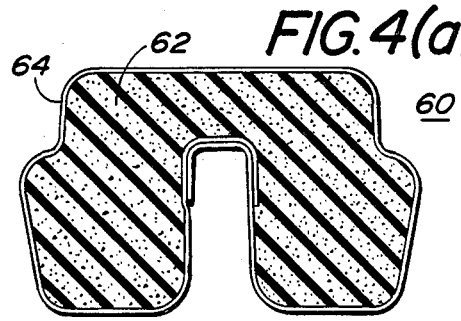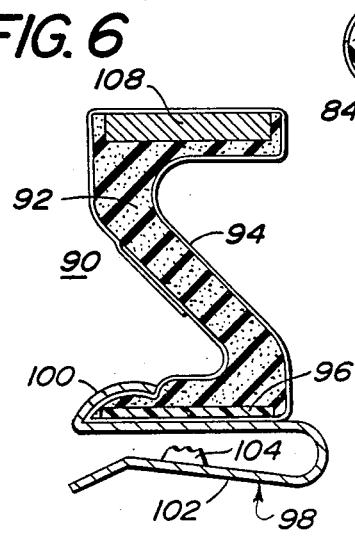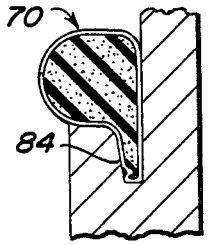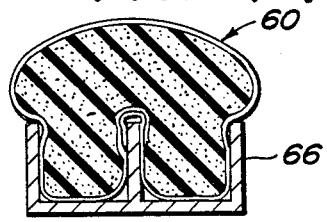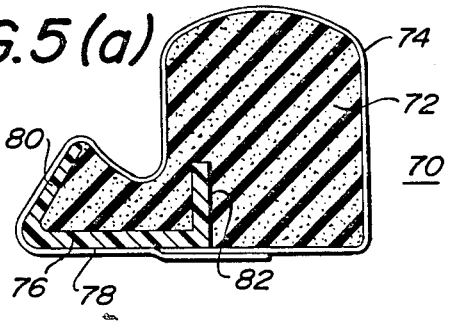

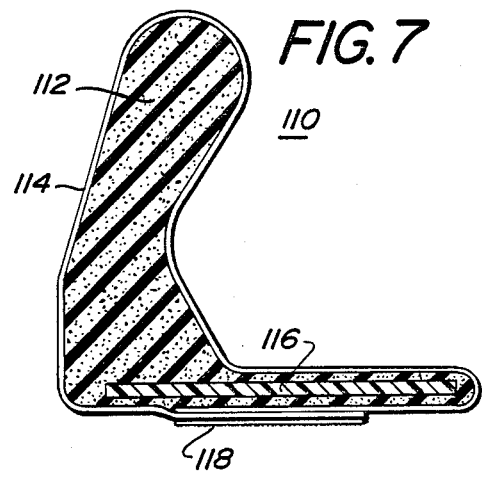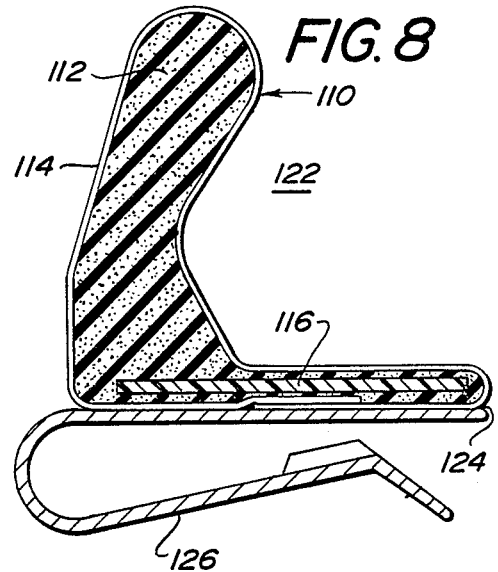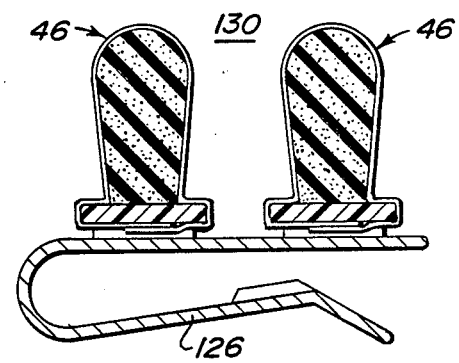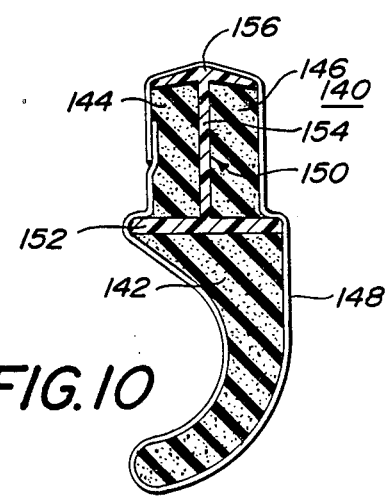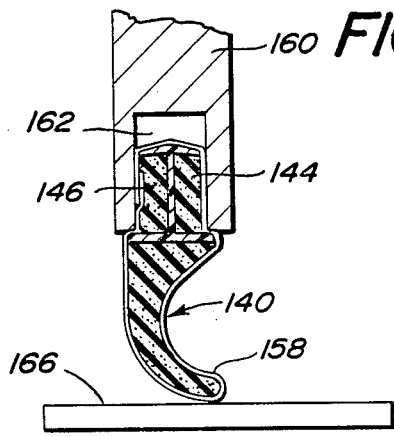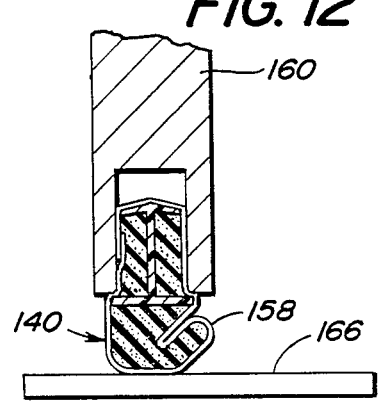

MULTI-FUNCTION GASKET

BACKGROUND OF THE INVENTION

1. Field of the Invention

This invention relates generally to the field of gaskets and seals. More particularly, this invention relates to the fields of: gaskets for electrical apparatus and the like which are prone to generate, or be adversely affected by electromagnetic interference (EMI) and/or radio frequency interference (RFI) from gaps in shielded or conductive housings; seals which are intended to reduce or eliminate noise emission; and, seals which are intended to reduce or eliminate environmental contamination or infiltration. Most particularly, this invention relates to a field of hybrid or multi-function gaskets and seals which combine the protective features of preventing EMI/RFI leakage, preventing audible noise emission and preventing environmental infiltration.

2. Description of Prior Art

Electromagnetic interference (EMI) has been defined as undesired conducted or radiated electrical disturbances from an electrical or electronic apparatus, including transients, which can interfere with the operation of other electrical or electronic apparatus. Such disturbances can occur anywhere in the electromagnetic spectrum. Radio frequency interference (RFI) is often used interchangeably with electromagnetic interference, although it is more properly restricted to the radio frequency portion of the electromagnetic spectrum, usually defined as between 10 kilohertz (KHz) and 10 gigahertz (GHz). Comprehensive technical summaries are available from a number of sources.

A shield is defined as a metallic or otherwise electrically conductive configuration inserted between a source of EMI/RFI and a desired area of protection, which has the capability of absorbing and/or reflecting EMI/RFI and reducing the energy levels thereof. As a practical matter, such shields normally take the form of an electrically conductive housing which is electrically grounded. The energy of the EMI/RFI is thereby dissipated harmlessly to ground. Such a shield may be provided to prevent EMI/RFI radiating from a source or to prevent EMI/RFI (generated randomly or by design) from reaching a target, or both. Most such housings are of necessity provided with access panels, hatches, doors and/or removable covers.

The gaps between the panels, etc. and the housing provide an undesired opportunity for EMI/RFI to pass through the shield. The gaps also interfere with electrical currents running along the surfaces of the housings from EMI/RFI energy which is absorbed and is being conducted to ground. The gaps reduce the efficiency of the ground conduction path and may even result in the shield becoming a secondary source of EMI/RFI leakage, from gaps which act as slot antennas.

Various configurations of gaskets have been developed over the years to close the gaps of such shields and to effect the least possible disturbance of the ground conduction currents. Each seeks to establish as continuous an electrically conductive path as possible across the gap(s). However, there are inevitable compromises between: the ability of the gasket to smoothly and thoroughly engage and conform to the surface of the housing adjacent the gaps; the conductive capacity of the gasket; the ease of mounting the gasket; the ability of the gasket to withstand abrasive wear and tear, as well as repeated compression and relaxation; and, the cost of manufacturing the gasket.

Electrical or electronic apparatus are often prone to acoustically noisy operation, which may become quite annoying to those in audible range of the apparatus, even in the absence of any specific technical difficulty caused by the audible noise. Noise emission can of course also result in technical problems under certain circumstances. Audibly noisy apparatus are sometimes provided with seals to reduce noise emission, but such seals are often only marginally effective at best. Moreover, such seals are not effective to prevent EMI/RFI leakage.

Electrical or electronic apparatus are also notoriously prone to damage or malfunction from environmental contamination or infiltration, the most common and perhaps most destructive contaminants being dust and moisture. Many electrical and electronic apparatus are provided with cooling fans, which are intended to draw air along a predefined path within the apparatus to maximize cooling. When the path is well defined, a filter can be used to collect dust and other debris prior to infiltration. Unfortunately, gaps of the kind described above too often provide alternate paths for contaminated air to enter the apparatus and eventually cause problems. Environmental seals, such as used in windows and doors have of course been known for some time, but such seals have never been capable of preventing EMI/RFI leakage.

The following patents are illustrative of the kinds of gaskets which have been proposed to prevent EMI/RFI leakage. Even a cursory analysis of such prior art will reveal the inability of such gaskets to function as EMI/RFI gaskets and as environmental infiltration seals and as audible noise seals; the inability of such gaskets to be manufactured relatively inexpensively; and, the inability of such gaskets to withstand abrasive wear and tear.

An RFI shielding gasket disclosed in U.S. Pat. No. 3,555,168 is formed as a conductive foil lamina bonded to a resilient foam backing by a flexible adhesive and is mounted by a pressure-sensitive adhesive on the back of the foam backing. The gasket is a flat member produced from flat layers of flat stock, rather than by extrusion or molding. In a preferred embodiment, the foam is a closed cell, medium density neoprene foam from 0.015 to 0.500 inches thick. The resulting laminate is die cut to shape, and is said to be RFI tight and dust tight. A seal disclosed in U.S. Pat. No. 3,312,769 has a resilient core, preferably neoprene sponge, surrounded by a metallic mesh, preferably an alloy of nickel and copper such as Monel. There is no indication the the core is bonded to the metallic mesh in any fashion. A sealing gasket disclosed in U.S. Pat. No. 2,477,267 comprises a resilient gasket having a network of electrically conductive wires embedded therein and therethrough, the wires having portions exposed on opposite surfaces, of the gasket. A seal disclosed in U.S. Pat. No. 3,466,906 comprises a body of resilient plastic foam material having a plurality of interconnected open cells and a coating of electrically conductive material provided throughout the body on the surfaces of the plastic elements. A conductive coating is preferably applied by electroplating to form a conductive surface on the seal. A seal available from Chomerics Corporation is denoted by the trademark MESH STRIP. The seal is available as resilient, single and dual, all-metal strips or compressed shapes. The seal is also available with an elastomer core, in round or rectangular profiles, the core being solid or hollow.

In so far as weather strip seals are of interest, mention is made of Q-LON brand weather strip seals manufactured and sold by Schlegel Corporation, assignee herein. The seals are formed by continuous molding processes wherein a foam core expands and cures in a travelling mold surrounded by a polyethylene or vinyl lamina, after which the lamina and foam adhere to one another. The continuous molding processes are described in U.S. Pat. Nos. 3,700,368 and 3,781,390. The seals may also be molded directly with or onto semi-rigid carriers used for reinforcing and/or mounting the seals. Such seals have never been capable of preventing EMI/RFI leakage, although such seals are generally acknowledged as superior environmental seals.

A number of other problems are not apparent from such patent references. For example, most prior art gaskets require compression of at least 50% in order to reach maximum effectiveness. Gaskets according to this invention require only approximately 25% compression. This reduces the costs of cabinets, panels and the like, which do not have to be as robust as otherwise necessary to withstand prior art compression forces. Moreover, the compression can be adjusted for specific load requirements, by selectively altering gasket profiles and the density (mass) of gasket cores.

As another example, the prior art is as yet unable to cope with signal radiation from rooms and building which are supposed to be "secure" against electronic surveillance techniques. When gaskets according to this invention are used for weatherstrips in doors and windows, rooms and whole buildings can be made more secure.

The gasket disclosed herein is the first product capable of preventing EMI/RFI leakage, preventing audible noise emission and capable of preventing environmental infiltration; as well as being particularly resistant to damage from abrasion, even sliding contact; and, capable of manufacture by continuous molding processes in a wide variety of profiles and embodiments, including integral carriers. The gasket disclosed herein is the first such product to embody an EMI/RFI gasket in a form sufficiently corresponding to environmental seals to enable a cross-over of production and manufacturing technology which results in a multi-function hybrid gasket/seal solving all of the problems plaguing prior art EMI/RFI gaskets.

SUMMARY OF THE INVENTION

It is an object of the invention to provide improved gaskets for preventing EMI/RFI leakage.

It is a further object of this invention to provide EMI/RFI gaskets which are also capable of preventing environmental infiltration or contamination.

It is another object of the invention to provide EMI/RFI gaskets which are also capable of preventing audible noise emissions.

It is yet another object of the invention to provide such a multi-function gasket in an integrally formed product.

It is yet another object of the invention to provide such an integrally formed multi-function gasket in a form easily adapted to seal gaps in shield housings of all shapes, sizes and geometries.

It is yet another object of this invention to provide such a gasket which can be manufactured by molding processes.

It is yet another object of this invention to provide such a gasket which is substantially less prone to damage from abrasion and similar wear and tear.

It is yet another object of the invention to provide such a gasket with a variety of integrally formed carriers to facilitate mounting and maintenance.

These and other objects of the invention are accomplished by a multi-function gasket for shields housing electrical apparatus and the like, operation of which tends to generate or be affected by, EMI/RFI, comprising: a resilient core with a sealed outer boundary layer; an electrically conductive sheath; and, means for mounting the gasket. The core is preferably a continuously molded, resilient foam core having a sealed outer boundary layer when cured. The sheath is preferably a flexible, electrically conductive and substantially abrasion resistant sheath surrounding the foam core and bonded to the boundary layer as the foam expands within and fills the interior of the sheath during the continuous molding. The shield may be sealed against EMI/RFI leakage, audible noise emission and environmental infiltration through perimeter gaps of electrically conductive doors, access panels and the like by the actions and interactions of the sheath, the foam core and the boundary layer. The flexible sheath is continuously pressed into positive and thorough contact with the conductive surfaces, between which it is mounted, by the resilient foam core, forming a continuous electrical path across the gaps and preventing EMI/RFI leakage through the gaps. The boundary layer prevents noise emission and environmental infiltration across the gaps. The cellular nature of the foam inhibits audible noise propagation through the gasket itself. Moreover, the sheath protects the boundary layer, and the underlying foam core, against damage from abrasion and the like.

The sheath is preferably a fabric, formed at least in part from electrically conductive fibers, or coated with an electrically conductive layer, or both. The metal surface, formed for example by electroless plating or sputtering, is not only highly resistant to damage from abrasion and the like, but is characterized by a relatively low coefficient of friction which enables the gasket to withstand sliding frictional contact. This provides an opportunity to mount the gasket in positions which are not appropriate for gaskets unable to withstand the rigors of sliding contact. The sheath may be provided with a coating on the interior surface thereof to inhibit bleeding of the foam through the sheath prior to curing.

The ability to manufacture the gasket in accordance with continuous molding technology reduces the cost of manufacture and enables the gasket to be molded with a carrier, for example a semi-rigid plastic, by means of which the gasket may be conveniently reinforced and/or mounted. It will be appreciated that multi-function gaskets according to this invention can also be produced, for example, by shot molding techniques. Such other techniques are not now believed to be as efficient as continuous molding techniques.

Multi-function shielding gaskets in accordance with this invention are preferably made from a compressible urethane foam core encapsulated within silver-coated nylon ripstop fabric. The conductive fabric is bonded to the foam as an integral part of the manufacturing process. The resilient urethane is formulated to provide minimum closing force with maximum attenuation.

The excellent memory of the urethane foam permits it to return readily to its original shape after cycling and to adjust to cabinet door gap dimensions or irregular surfaces. Urethane wrapped in conductive fabric also assures shielding/sealing continuity. Corners are easily accommodated, and even cabinet hinges can be shielded and sealed. Further benefits include light, dust and noise sealing, as well as providing a solid protective barrier against the intrusion of moisture and humidity.

EMI/RFI shielding/sealing gaskets offer an extremely high degree of shielding effectiveness. Test results (in accordance with the SAE-ARP 1705 transfer impedance test) from a three-eighth inch ($\frac{3}{8}''$) by three-eighth inch ($\frac{3}{8}''$) in cross-section gasket with silver coated ripstop nylon, revealed attenuation, measured in decibels(dB) of approximately 80–90 dB from 1 KHz through 1 MHz; approximately 60–70 dB from 1 MHz through 100 MHz; and, 55–60 dB from 100 MHz to 1 GHz.

Multi-function gaskets according to this invention are durable, dimensionally stable and safe. There are no wire strands or metal fingers that can snag or break; no ends to fray, and ends do not require potting. There is no shrinkage under heat or stretching during installation. There are no sharp edges, metal or otherwise, which are often prone to break. Even more importantly, people are protected from nicks and cuts, and equipment is never vulnerable to loose foreign conductive material.

Multi-function gaskets according to this invention provide very low closing force for cabinet doors and hatch covers. In fact, such closing forces can actually be reduced as much as ten times. Even so, the foam core enables the gasket to fill cavities and irregular spaces and thereby maintain shielding integrity. The very low closing forces greatly simplify the mounting problems heretofore experienced for such gaskets. Gaskets formed from relatively stiff metallic parts require substantial and robust mounting hardware. EMI/RFI gaskets according to this invention can, in very many instances, be mounted on flat surfaces by pressure-sensitive adhesives. In many instances, no special mounting grooves or hardware need ever be provided. Wherever appropriate, the urethane foam may be formulated as an unburnable char-foam, which will maintain at least an environmental seal, against passage of noxious gases and smoke even under the thermal loads of fire conditions.

These and other objects and advantages of the invention will become apparent to those skilled in the art from the following detailed description of the preferred embodiments of the invention, shown in the accompanying drawings.

BRIEF DESCRIPTION OF THE DRAWINGS

For the purpose of illustrating the invention there are shown in the drawings forms which are presently preferred; it being understood, however, the the invention is not limited to the precise arrangements and instrumentalities shown.

FIG. 1 is a perspective view and cross-section of a multi-function gasket according to a first embodiment of the invention;

FIG. 2 is a cross-section through a multi-function gasket according to a second embodiment of the invention;

FIG. 3 is a cross-section through a multi-function gasket according to a third embodiment of the invention;

FIG. 4(a) is a cross-section through a multi-function gasket according to a fourth embodiment of the invention;

FIG. 4(b) is cross-section through a mounted seal, of the kind shown in FIG. 4(a), in reduced scale;

FIG. 5(a) is a cross-section through a multi-function gasket according to a fifth embodiment of the invention;

FIG. 5(b) is a cross-section through a mounted seal, of the kind shown in FIG. 5(a), in a reduced scale;

FIG. 6 is a cross-section through a multi-function gasket according to a sixth embodiment of the invention;

FIG. 7 is a cross-section through a multi-function gasket according to a seventh embodiment of the invention;

FIG. 8 is a cross-section through a multi-function gasket according to a eighth embodiment of the invention;

FIG. 9 is a cross-section through a multi-function gasket according to a ninth embodiment of the invention;

FIG. 10 is a cross-section through a multi-function gasket according to a tenth embodiment of the invention; and, FIGS. 11 and 12 illustrate mounting and operation of the gasket shown in FIG. 10.

Throughout the drawings, the thicknesses of various fabric sheaths, adhesive coatings and semi-rigid plastic carriers are shown in exaggerated scale to facilitate description and illustration of the invention.

DETAILED DESCRIPTION OF THE PREFERRED EMBODIMENT

The simplest embodiment of a multi-function gasket according to this invention is shown in FIG. 1 and generally designated by reference numeral 10. The multi-function gasket 10 comprises a continuously molded foam core 12, which is resilient and compliant over a wide range of temperatures and which exhibits good compression set characteristics, that is, the material will "spring back" even after repeated compression and decompression and even after long periods of compression. The foam core is covered by a sheath 14 formed from an electrically conductive fabric material. The sheath 14 is bonded to the foam core during a continuous molding process in which the foam blows or expands inside of the sheath, the sheath being wrapped around the foam as it enters a travelling mold. The ends 16 and 18 of the sheath preferably overlap. This continuous molding process is described generally in commonly owned U.S. Pat. Nos. 3,700,368 and 3,781,390, the teachings of which are incorporated herein by reference. Accordingly, this process will not be described in greater detail herein.

The fabric may be conductive by reason of being formed directly from electrically conductive fibers or by reason of later treatment of the fabric by coating, or otherwise, with an electrically conductive material. The fabric may of course also be formed from a combination of electrically conductive fibers and after-treatment with an electrically conductive material. Examples of fabrics formed by weaving, braiding or knitting fabrics from conductive fibers are described in U.S. Pat. No. 4,684,762, the teachings of which are incorporated by reference. Another example is a silver coated fabric, woven first from 100% ripstop nylon and then made electrically conductive through a scouring and electroless plating process. The conductive material may also be applied by sputtering. This fabric material has been available in the market place for several years and is commonly made in both 30 denier (a unit expressing the fineness of silk, rayon, nylon and other yarns as a function of weight in grams per length; lower denier numbers indicating finer yarn)and 100 denier material. The specific processes by which these kinds of fabrics are made do not form part of this invention, and accordingly, are not described in detail herein.

As the foam core cures, a sealed outer boundary level 20 forms on the outer surface thereof, facing the inner surface of the sheath 14. The outer boundary layer has an adhesive character which effects a strong bond between the foam core and the sheath. This bonding is sufficient for securing the sheath over the core. Under some circumstances, the pressures of molding and blowing forces some foam to bleed through the fabric before curing. Although this provides an even stronger bond between the core and the sheath, the electrical continuity of the sheath is compromised. When such bleeding is a problem, a supplemental layer or coating 22 on the interior surface of the sheath prevents the foam from bleeding or leaking through the sheath, before the core cures. Adhesion of the sheath is promoted, with or without the coating or layer 22, by reason of the surface roughness of the fabric, to which the foam or coating strongly adheres. The foam core and coating are preferably compatible with regard to adhering to one another. The weave of a typical fabric 14 is shown in enlarged scale in circle I. The layer 22 is shown in enlarged and exaggerated scale, for purposes of illustration, in circle II. The layer 22 is also useful for bonding the overlapped edges 16 and 18 of the sheath to one another, at least remote from outer extreme edge 24. An adhesive strip 26 can be attached at the overlapped edges 16, 18, over extreme edge 24. A flame retardant organic layer or coating 22, preferably urethane, is presently preferred. Flame retardant urethane formulations are available commercially.

FIG. 2 illustrates a profile which is shaped somewhat differently of that of FIG. 1, but is otherwise structurally similar. Gasket 30 comprises a foam core 32 surrounded by electrically conductive sheath 34, the ends 36, 38 of which overlap one another. A strip of pressure sensitive adhesive 40 is provided for mounting the gasket. The gasket may be provided with a supplemental layer comparable to layer or coating 22 as shown in FIG. 1, to inhibit bleeding. The details of this aspect of the invention are the same in all of the illustrated embodiments, as in FIG. 1 Accordingly, these details are omitted from FIGS. 2–12 and from the following description. It will be appreciated by those skilled in the art that utilization of a layer or coating comparable to coating 22 will be more appropriate in certain circumstances than in others.

A reinforced profile 46 is illustrated in FIG. 3. In this case, a foam core 48 is molded onto a semi-rigid carrier 52, both of which are surrounded by conductive sheath 50. The carrier 52 imparts extra strength and some measure of rigidity. The plastic carrier may be formed from a number of suitable plastics, for example, polypropylene, as well as from paper, for example, kraft paper. It will be appreciated that the thickness of carrier 52 is exaggerated in scale to facilitate illustration thereof, this being the case for all such carriers shown in the drawings. The actual thickness of the carrier will depend upon the material from which it is made, it being necessary to provide some rigidity and some flexibility. Even so, typical thicknesses are 0.015 to 0.040 inches. Gasket 46 may be provided with a pressure-sensitive adhesive 54 for purposes of mounting the gasket. Alternatively, in lieu of adhesive 54, the carrier may form mounting means for securing the seal in an inverted T-slot, as weatherstrips are sometimes mounted.

The gasket 60 shown in FIG. 4(a) illustrates the large measure of freedom in design which can be achieved with multi-function gaskets according to this invention. The bun gasket 60 comprises a foam core 62 covered by electrically conductive sheath 64. Gasket 60 can be mounted by insertion into grooves of corresponding shape or by use of pressure-sensitive adhesive along almost any surface portion thereof. Gasket 60 is shown mounted in double grooved structure 66 in FIG. 4(b) as a sliding door seal.

The gasket 70 shown in FIG. 5(a) illustrates an embodiment wherein a semi-rigid carrier is utilized for mounting the gasket in a kerf structure 84, for example a door or window frame, as shown in FIG. 5(b). Gasket 70 comprises a foam core 72 molded with or onto a semi-rigid carrier 76. Carrier 76 has a base portion 78 and a leg portion 80, defining a portion of the outer boundary of the gasket 70. Another leg 82 projects into the foam core 72. An electrically conductive sheath 74 surrounds both the core 72 and the boundary portions of carrier 76. Carrier 76 of gasket 70 will typically be thicker than carrier 52 of gasket 46 to accommodate the compression mounting loads, which can be appreciated from FIG. 5(b).

An alternative mounting structure is shown in FIG. 6. A gasket 90 has a substantially Z-shape cross section. A foam core 92 is molded onto and over a semi-rigid carrier 96 and a strip of magnetic material 108. The foam core 92, carrier 96 and magnetic strip 108 are surrounded by electrically conductive sheath 94. A metal clip 98 has a leg 102 for slipping over the edges of a metal panel, and is provided with a plurality of engagement prongs 104 along its length. The clip 98 also has a leg 100 which is forceably bent over and pressably engages a portion of that leg of the seal 90 in which the carrier 96 is disposed. This ensures excellent electrical contact between the metal clip 98 and the electrically conductive sheath 94. The provision of a magnetic strip 108 illustrates that secure electrically conductive contact can be effected in an alternative fashion to compression of the seal. Such a seal will be effective even where the gap in a shield to be sealed is between two parts which move relative to one another during operation of the electrical apparatus. Such movement is typical where heavy equipment is shock-mounted on springs or the like. Such a seal is also effective for sealing gaps of different or varying width.

A gasket 110 having yet another configuration is shown in FIG. 7. Although the shape is different from the gaskets described herein before, the structural elements of the gasket 110 are essentially the same. A foam core 112 is molded over or with a semi-rigid carrier 116, both of which are surrounded by an electrically conductive sheath 114. The gasket may be mounted by means of pressure-sensitive adhesive 118. The gasket 110 may come as shown in FIG. 7, being mounted directly on a flat surface to which the adhesive will adhere. An alternative mounting arrangement for the same gasket is shown in FIG. 8. In FIG. 8, a gasket assembly 122 is formed by affixing gasket 110 to one leg 1 to 4 of a metal clip 126.

A variation of the gasket assembly shown in FIG. 8 is illustrated in FIG. 9. Gasket assembly 130 comprises two gaskets 46, as otherwise shown in FIG. 3, affixed to a metal clip 126. A comparison of FIGS. 1 through 9 serves to highlight the tremendous design flexibility which is imparted to the field by reason of the structural interactions of the various components from which gaskets according to this invention are formed.

Yet another mounting system is illustrated in FIGS. 10, 11 and 12. With reference first to FIG. 10, a gasket 140 has three foam core sections 142, 144 and 146 molded over and with a semi-rigid carrier 150. The carrier 150 has a stop or base portion 152, a segment 154 to inhibit longitudinal compression and a pair of deflectable fin portions 156. The three foam core sections and the carrier are surrounded by an electrically conductive sheath 148. The gasket 140 is adapted to be pressably inserted into a groove 162 of a door or panel 160, as shown in FIG. 11. The deflectable fin portions 156 of the carrier 150 inhibit movement of the seal out of its mounting position. The foam core sections 144 and 146 ensure good electrical contact between the electrically conductive sheath 148 and the corresponding engaged surfaces of the door 160 defining the groove 162. The door 160 may be all metal, as shown, or may be metal clad or may be formed from other conductive materials, for example, conductive plastics. Foam core portion 142 and that portion of the electrically conductive sheath 148 extending therearound, form a sealing tongue 158, which engages the surface of member 166. Member 166 may also be metallic, metal clad or formed from other conductive materials. Upon further closing of the gap and compression of the gasket, as shown in FIG. 12, sealing tongue 158 folds around and presents a broad portion of itself for engaging and sealing against member 166. The base segment 152 of carrier 150 presents unwanted movement and compression of the gasket 140 further into the groove 162 as the compression load increases.

Gasket 140 is particularly effective for doors. Even repeated sliding movement of the electrically conductive sheath 148 over the surface of member 166 does not noticeably degrade surface resistivity to any measurable extent. Gasket 140 is also useful because gaps of varied width may be sealed with the same part, whereas prior art seals might require three or more models of different dimensions to close gaps in the same range.

Multi-function gaskets, according to this invention, may also be used in combination with a movable closure assembly forming a weatherstripped window, door or the like, wherein the multi-function gasket forms at least some of the weatherstripping, and further comprising means for electrically grounding the sheath. Electrical signals radiated on one side of the closure assembly will be blocked from radiating through weatherstripped gaps in the closure assembly sealed by the multi-function gasket, thereby inhibiting reception of the signals on the other side of the closure assembly by electronic surveillance techniques. The closure assembly will have a frame for a window, door or the like on which the weatherstripping may be mounted, and the frame may comprise means for electrically grounding the sheath. The frame may be formed at least in part from electrically conductive material in electrical contact with the sheath and in electrical contact with means for electrically grounding the frame.

The variety of embodiments of EMI/RFI gaskets according to this invention, illustrated and described herein, have been presented to demonstrate the widespread utility and flexibility of the invention. The variety of embodiments should not obscure the essential characteristics of all EMI/RFI gaskets made in accordance with this invention. An EMI/RFI gasket characteristic of this invention comprises: a resilient core, a flexible, abrasion resistant, electrically conductive sheath surrounding the resilient core and means for affixing or mounting the gasket. Gaskets may be optionally provided with semi-rigid carriers or reinforcing strips and may optionally be provided with magnetic strips to enhance sealing contact. The mounting means may include adhesives, resilient or spring-type clips or profiles of specific cross-section, adapted for insertion into grooves of corresponding shape. The resilient or spring-type clips may be embodied in exterior metal spring clips or internal profiles of carriers having deformable or deflectable locking ribs. Semi-rigid carriers may also be provided with apertures for receiving or engaging fastening members.

The invention may be embodied in other specific forms without departing from the spirit or essential attributes thereof. Accordingly, reference should be made to the appended claims, rather than to the foregoing specification, as indicating the scope of the invention.

What is claimed is:

1. A multi-function gasket for electrical apparatus and the like, operation of which tends to generate or be adversely affected by electromagnetic and radio frequency interference (EMI/RFI), comprising:
   a continuous, molded, resilient foam core having a sealed outer boundary layer;
   a flexible, electrically conductive and substantially abrasion resistant sheath externally surrounding the foam core and bonded to the boundary layer, the foam filling the interior of the sheath and,
   means for mounting the gasket, whereby an apparatus may be sealed against EMI/RFI leakage, noise emission and environmental infiltration through perimeter gaps of electrically conductive doors, access panels and the like by the actions and interactions of the sheath, the foam core and the boundary layer, the flexible sheath being continuously pressed by the resilient foam core into positive engagement with conductive surfaces between which the gasket may be mounted, forming a continuous electrical path enclosing the foam core, extending continuously across the gaps, and preventing EMI/RFI leakage through the gaps, the boundary layer preventing noise emission and environmental infiltration across the gaps and the sheath protecting the boundary layer against damage from abrasion and the like.

2. The gasket of claim 1, further comprising a coating on the interior surface of the sheath to inhibit bleeding of the foam through the sheath during the continuous molding.

3. The gasket of claim 1, wherein the sheath comprises a fabric material.

4. The gasket of claim 3, wherein the fabric is formed from non-conductive fibers and thereafter provided with a conductive coating.

5. The gasket of claim 3, wherein the fabric is formed at least in part from conductive fibers.

6. The gasket of claim 1, wherein the foam comprises a self-extinguishing char foam.

7. The gasket of claim 1, further comprising a semi-rigid carrier onto which the foam core is molded.

8. The gasket of claim 1, wherein the mounting means comprises adhesive strips.

9. The gasket of claim 1, wherein the mounting means comprises metal clips.

10. The gasket of claim 7, wherein the mounting means is formed at least in part by the carrier.

11. A multi-function gasket for electrical apparatus and the like, operation of which tends to generate or be adversely affected by electromagnetic and radio frequency interference (EMI/RFI), comprising:
a molded, resilient core having a sealed outer boundary layer;
a flexible, electrically conductive and substantially abrasion resistant sheath surrounding the core and bonded to the boundary layer, the core filling the interior of the sheath; and,
means for mounting the gasket, whereby an apparatus may be sealed against EMI/RFI leakage, noise emission and environmental infiltration through perimeter gaps of electrically conductive doors, access panels and the like by the actions and interactions of the sheath, the core and the boundary layer, the flexible sheath being continuously pressed by the resilient core into positive engagement with conductive surfaces between which the gasket may be mounted, forming a continuous electrical path across the gaps and preventing EMI/RFI leakage through the gaps, the boundary layer preventing noise emission and environmental infiltration across the gaps and the sheath protecting the boundary layer against damage from abrasion and the like.

12. The multi-function gasket of claim 11, comprising a continuous molded core, the core being bonded to the sheath continuously along facing surfaces of the core and the sheath.

13. The multi-function gasket of claim 11, comprising a resilient foam core, the foam core filling the sheath, bearing resiliently outwardly against the sheath and bonding thereto.

14. The multi-function gasket of claim 11, comprising a shot molded core.

15. The multi-function gasket of claim 11, comprising a shot molded foam core.

16. A movable closure assembly forming a weatherstripped window, door or the like, comprising:
a multi-function gasket having a continuous, molded, resilient foam core with a sealed outer boundary layer;
a flexible, electrically conductive and substantially abrasion sheath externally surrounding the foam core and bonded to the boundary layer, the foam filling the interior of the sheath; and,
means for mounting the gasket along facing conductive surfaces of said window, door or the like, the multi-function gasket forming at least some weather stripping of said movable closure assembly, and further comprising means for electrically grounding the sheath, whereby electrical signals radiated on one side of the closure assembly will be blocked from radiating through weatherstripped gaps in the closure assembly sealed by the multi-function gasket, thereby inhibiting reception of the signals on the other side of the closure assembly by electronic surveillance techniques.

17. The combination of claim 16, wherein the closure assembly has a frame for a window, door or the like on which the weatherstripping is mounted, and the frame comprises means for electrically grounding the sheath.

18. The combination of claim 17, wherein the frame is formed at least in part from electrically conductive material in electrical contact with the sheath and in electrical contact with means for electrically grounding the frame.

* * * * *

UNITED STATES PATENT AND TRADEMARK OFFICE
CERTIFICATE OF CORRECTION

PATENT NO. : 4,857,668
DATED : August 15, 1989
INVENTOR(S) : Buonanno

It is certified that error appears in the above-identified patent and that said Letters Patent is hereby corrected as shown below:

Column 2, line 52, after "indication", delete "the", first occurrence, and insert --that--.
Column 5, line 54, after "however", delete "the", second occurrence.
Column 7, line 47, after "FIG 1", insert a period.

Claim 4: column 10, line 59, delete "and thereafter" and insert --, the fabric being--.

Signed and Sealed this

Eleventh Day of June, 1991

*Attest:*

HARRY F. MANBECK, JR.

*Attesting Officer*  *Commissioner of Patents and Trademarks*